(12) United States Patent
King et al.

(10) Patent No.: US 6,697,254 B1
(45) Date of Patent: Feb. 24, 2004

(54) COMPUTER SYSTEM

(75) Inventors: James Edward King, Wokingham (GB); Stephen Richard Hanson, Aldworth (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/236,030

(22) Filed: Sep. 5, 2002

(51) Int. Cl.[7] .............................. G06F 1/20; G06F 1/28; H05K 7/20
(52) U.S. Cl. ...................... 361/687; 710/126; 713/300; 713/100; 702/132; 165/80.4; 165/104.33
(58) Field of Search ................................ 361/687, 683, 361/688–695; 710/100, 126; 713/300, 100, 1; 702/132–133, 99; 165/104, 33, 200, 80.1–80.5

Primary Examiner—Lisa Lea-Edmonds
(74) Attorney, Agent, or Firm—Meyertons Hood Kivlin Kowert & Goetzel, P.C.; B. Noël Kivlin (57) ABSTRACT

A computer system, for example a network server, comprises a service processor for providing system management functions for the system, and at least one peripheral component that communicates with, and/or is controlled by, the service processor via a communication or control line. The system includes a timer that is initialised by the service processor at a predetermined rate. If the timer is not initialised within a certain time period, it will reset the peripheral device to a different state, e.g. a quiescent state or one that is independent of the service processor. The timer is separate from the service processor and the service processor sends initialisation signals to the timer along the communication or control line.

27 Claims, 10 Drawing Sheets

COMPUTER SYSTEM

BACKGROUND OF THE INVENTION

This invention relates to computer systems, and especially to computer systems that are employed as servers.

The systems may for instance be employed as servers for example in local area networks (LANs) or in wide area networks (WANs), telecommunications systems or other operations such as database management or as internet servers. Such servers may be used in so-called "horizontally scaled" applications in which tens or hundreds of corresponding servers are employed as part of a distributed system.

A typical computer employed for such purposes will comprise two or more processors mounted on a motherboard, together with power supply units (PSUs), and other components such as hard disc drives (HDDs), fans, digital video disc (DVD) players, memory modules, ethernet ports etc. One or more of the processors, the host processor(s), provides the main functions of the server, and may communicate with a number of peripheral components, including communication ports, optionally via peripheral component interconnect (PCI) bridges in order to provide server operation. One of those peripheral components, called the "South Bridge" further allows the host processors to communicate with internal devices via serial interfaces one of which transports the console interface of the processors.

In addition to the host processor(s), the system may include another processor, called the service processor or the remote management controller (RMC), which provides management functions for the system assembly. Such functions may include environmental monitoring, temperature monitoring of the enclosure, fan speed control, data logging and the like. The service processor may communicate with the host processor or with one of the host processors, and may also have one or more external communication ports so that a user or network administrator can communicate with the service processor, or can communicate with the host processor(s) via the service processor. For example, the service processor may have its own ethernet network port for direct communication to the network administrator.

Fan speed is controlled by the service processor in order to minimise the amount of vibration and noise in the neighbourhood of the equipment, and, more importantly, in order to increase the life of the fans. With proper fan speed control, it is possible to extend the life of the fans by an order of magnitude or more, so that the fan lifetime is generally equivalent to that of the computer system. This is advantageous in the case of those systems in which it may not be possible to change the fans without shutting the system down, since any change of fans will be associated with downtime of the system.

However, intelligent devices such as service processors are prone to function failures, and in order to reduce the amount of downtime of the system, it is desirable to enable the system to continue to function in the event of a failure of the service processor for whatever reason. Such a failure may be a hardware failure of the service processor or of any lines that are controlled by it, or may be a software failure, for example due to interference from other equipment, errors in memory modules or errors in packets that are received from the network, any of which may corrupt programs in the service processor.

The service processor may be provided with an internal "watchdog" which requires initialising at periodic intervals in order to check that the service processor is functioning correctly, and, if it is not initialised, will reset the service processor. However, such an arrangement may not, on its own, protect the system from some forms of malfunction. For example, with some forms of malfunction, the service processor may fail to send any commands to peripheral components but will still re-initialise the internal watchdog when required. With other forms of malfunction, a failure of the management bus or other line may prevent commands or data that are sent by the service processor being received by the relevant peripheral device. In such cases, for example, the system might continue to operate without fan speeds being adjusted to take into account temperature changes in the system enclosure.

SUMMARY OF THE INVENTION

According to one aspect of the present invention, there is provided a computer system which comprises:

(i) a service processor for providing system management functions for the system;

(ii) at least one peripheral component that communicates with, and/or is controlled by, the service processor via a communication or control line; and (iii) a timer that is separate from the service processor and which will set the peripheral component into a different state unless the timer is initialised by the service processor at a predetermined rate;

wherein the service processor sends initialisation signals to the timer along the communication or control line.

The system according to this aspect of the invention has the advantage that the control signals that are sent to initialise the timer must be sent from the service processor outputs along the relevant internal lines of the system, and so any failure of either the service processor or of the internal lines will cause the timer to expire and set the peripheral component to its different state.

A separate timer may be employed, or a timer may be integrated into one or more of the peripheral components.

The different state of the peripheral component will depend on the type and purpose of the particular component. Normally, the state will be one in which the peripheral component is quiesced or will operate independently of the service processor. For example, in one aspect of the invention, the peripheral component is a fan controller which receives fan speed signals from the service processor and provides a driving signal for the fans. In this case, if the timer expires, the fan controller may be arranged to increase the fan speed to a constant value, for example maximum speed, to ensure that the system enclosure is adequately cooled in the absence of intelligent fan control from the service processor.

In another aspect of the invention, for example where the computer system forms a server in a network, the peripheral component may be a physical interface for a system management ethernet port that enables the system to communicate with a network administrator. If the service processor malfunctions, interference from other components in the system, in particular from any other processors that may be operating, may be picked up by lines connecting the service processor to the physical interface. This interference would then be treated as a signal by the physical interface, and coded and sent along the external lines to the network. In this case, the timer will quiesce the physical interface so that no such signals can be sent.

In yet another aspect, the peripheral component may form part of a serial port that can communicate with both the host processor and with the service processor. In one such system, the port is connected to the host processor and the service processor by means of a multiplexer, so that signals from the serial port are routed to the host processor via the service processor. If the service processor malfunctions, the timer may cause the multiplexer to route the signals directly between the serial port and the host processor, thereby bypassing the service processor.

According to another aspect of the invention, there is provided a method of operating a computer system which comprises:

(i) sending signals from a service processor to a peripheral component and to a timer along an internal communication or control line at a predetermined minimum rate;

(ii) initialising the timer on receipt of the signals by the timer; and (iii) setting the peripheral component into a different state if the timer has not been initialised within a predetermined time period.

BRIEF DESCRIPTION OF THE DRAWINGS

Embodiments of the present invention will now be described in detail by way of example with reference to the accompanying drawings, in which corresponding parts age given like reference numbers. In the drawings.

DESCRIPTION OF PARTICULAR EMBODIMENTS

Figure 1:
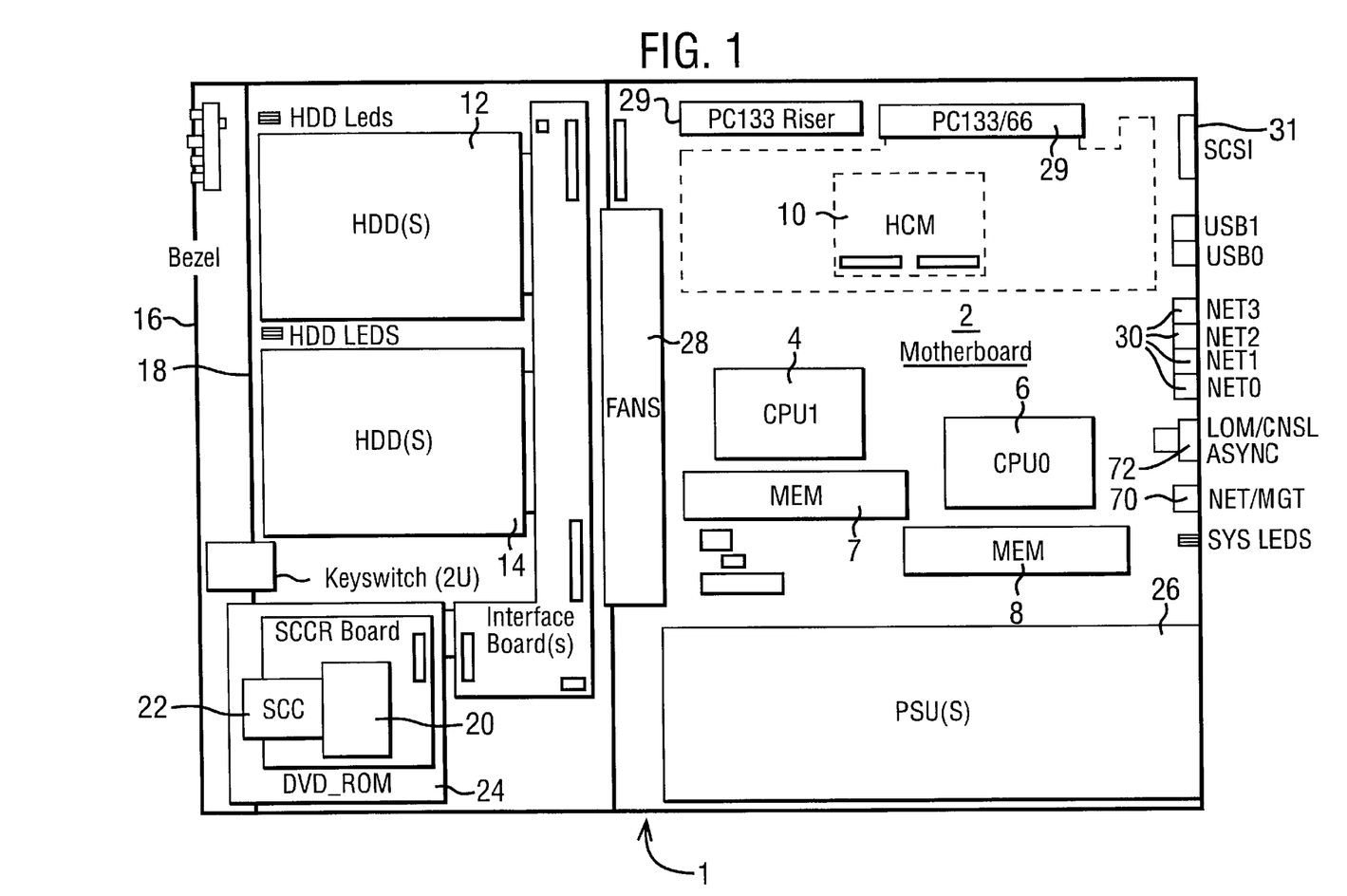
FIG. 1 is a physical plan view of one form of computer system according to one aspect of the present invention.

Referring now to the drawings, in which like reference numerals are used to designate corresponding elements, FIG. 1 shows a physical plan view of a narrow form factor computer that is intended to provide a rack mounted server for use with the internet or as part of a local area network (LAN) or for other telecommunications purposes, and is designed to fit into, for example a nineteen inch rack electronics cabinet. Other sizes may alternatively be employed, for example to fit into 23 inch or metric racks. The assembly may be designed to be a so-called high "RAS" system, that is to say, to have high reliability, availability and serviceability. As such, it is intended that the system will be operated with the minimum amount of down time.

The computer comprises an enclosure 1 that contains a motherboard 2 in the form of a printed circuit board (PCB) designed in a custom form-factor to fit the enclosure 1 and chosen to minimise the cabling within the enclosure. The motherboard 2 carries the majority of circuitry within the computer. On the motherboard are mounted one or more (in this case two) host processors or central processing units (CPUs) 4 and 6, each of which is provided with its own dedicated cooling in the form of an impingement fan that clips onto the CPU socket. Each processor 4, 6 is provided with its own dedicated block of memory 7, 8, for example provided in the form of one or two banks of dual in-line memory modules (DIMMs) with a total of 256 MB to 16 GB block capacity although other forms and sizes may be used.

A hardware cryptographic module (HCM) 10 may also be located on the motherboard. The HCM may be provided on a mezzanine card which plugs directly into the motherboard, and contains a co-processor providing cryptographic protocol acceleration support for security algorithms used in private community applications.

Two hard disc drives (HDDs) 12 and 14 may be located at the front of the computer behind the front bezel 16. The drives can be hot-pluggable if desired and may be accessible by removal of the bezel and EMI shield 18. Two internal HDDs can plug directly into the motherboard via right-angled connectors located on the front edge of the motherboard 2.

Next to the HDDs a system configuration card reader (SCCR) 20 may be arranged that is able to read a system configuration card (SCC) 22 inserted therein. The SCC contains all relevant information concerning the computer, so that it is possible to replace one computer with another simply by inserting the original SCC into the new computer and replacing the hard disc drives with those of the original computer.

A removable media drive bay may be provided to allow optional fitting of a slimline (notebook style) digital video disc or digital versatile disc (DVD) drive 24 for reading CD and DVD media. The media transport loader is accessible through a slot in the enclosure bezel 16.

One or two 320 W or 400 W custom power supply units (PSUs) 26 may also be provided. In addition to the dedicated CPU fans, the assembly may be cooled by means of a row of fans 28 mounted between the motherboard and the media drive bays.

The computer can support input/output (I/O) expansion by means of peripheral component interconnect (PCI) cards that plug into expansion slots. These may be accommodated by means of riser cards 29 that plug directly into the motherboard 2.

A number of I/O interfaces and sockets may be provided along the rear surface of the enclosure 1, including four ethernet ports 30, a network management ethernet port 70, and a serial port 72. The network management ethernet port 70 and the serial port 72 allow user access to the service processor and system console.

Figure 2:
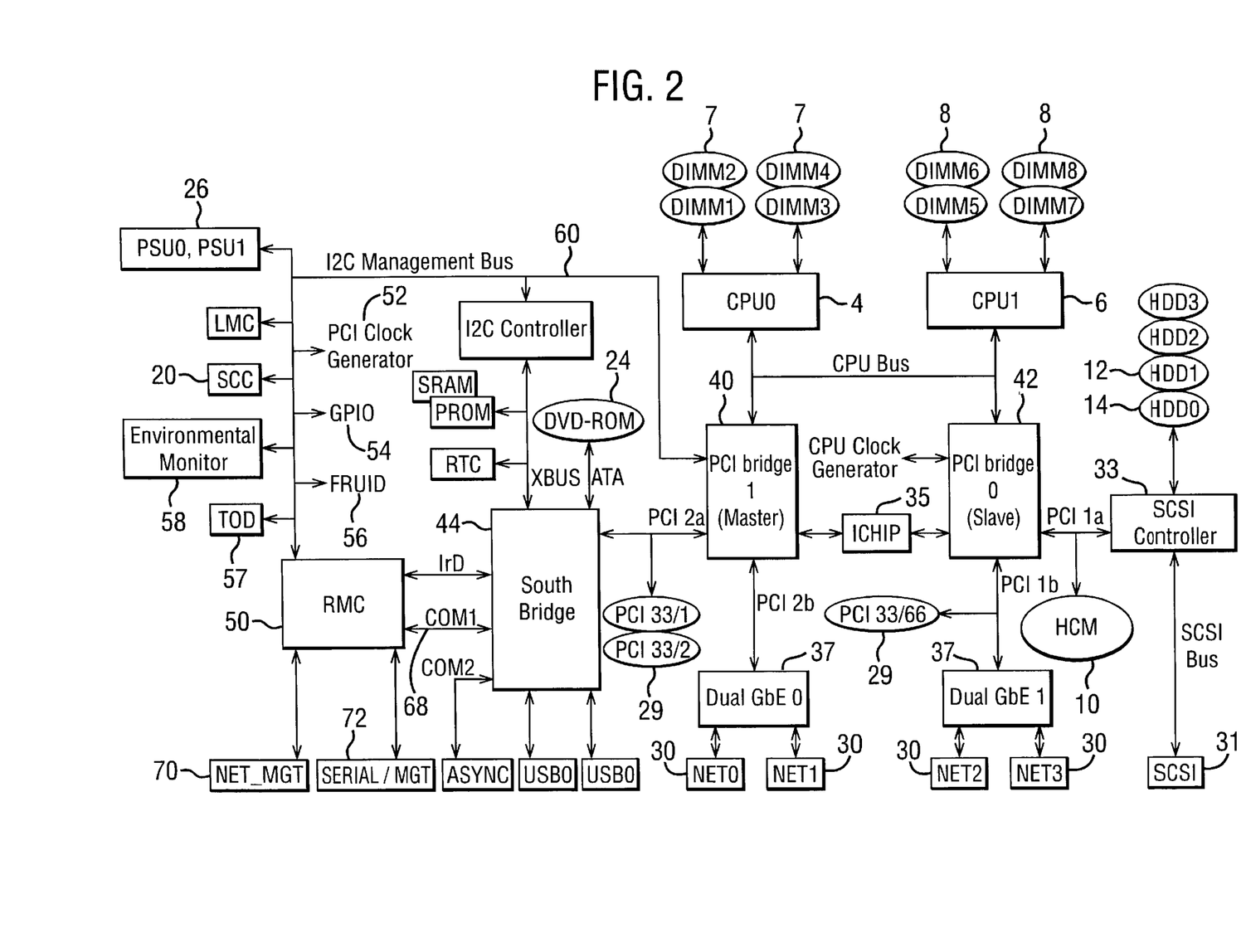
FIG. 2 is a schematic block diagram showing the system architecture of the system of FIG. 1.

FIG. 2 is a schematic representation of the system architecture of the computer system according to the invention.

Two host processors or CPUs 4 and 6 for example available from Sun Microsystems under the name UltraS-PARCIIIi may be provided having an integer execution unit, a floating point and graphics unit, 32 kB level 1 instruction cache, 64 kB level 1 data cache, 1 MB (256 k×32) level 2 data cache, a memory controller with error correction code (ECC) and an interface controller for the processor bus although any other appropriate processor may be employed. Four DIMM sockets 7 and 8 may be associated with each CPU.

The CPUs 4, 6 may be connected to two PCI bridges 40, 42 which provide interfaces to independent 64 bit PCI buses leading to various peripheral components such as the riser cards 29, HDDs 12 and 14, the HCM 10, the small computer system interface (SCSI) controller 33 and port 32, the interrupt chip 35 and the dual gigabit ethernet port controllers 37. The PCI bridge 40 is also connected to a PCI I/O device 44 also referred to as "South Bridge". This is an integrated PCI sub system which provides an integrated drive electronics (IDE) controller, a universal serial bus (USB) controller, independent universal asynchronous receiver/transmitters (UARTs), XBUS bridge and a power management controller. The PCI I/O device 44 also provides the console interface for enabling user access to the host processors 4 and 6.

Figure 3:
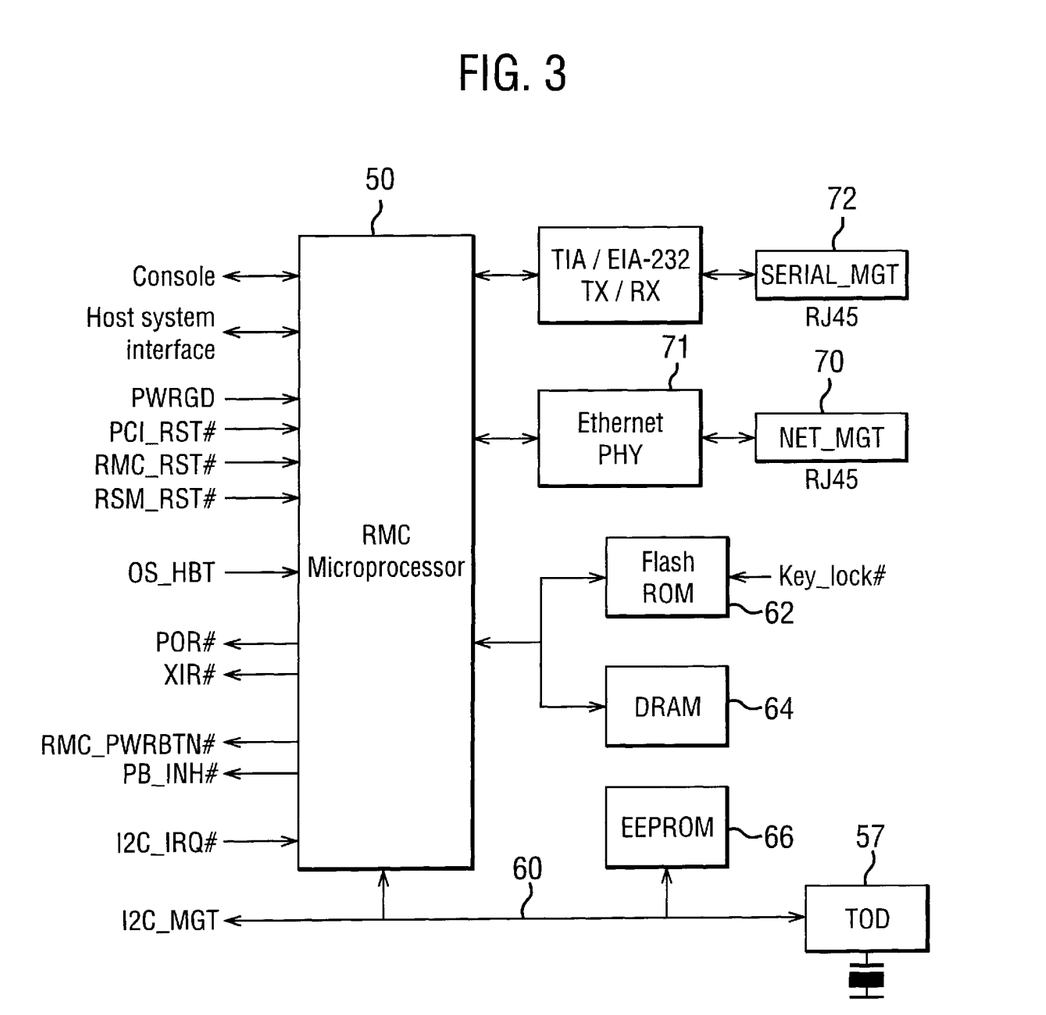
FIG. 3 is a schematic diagram showing the service processor and various peripheral components.

A service processor or remote management controller (RMC) 50 is included for providing local and remote management services and is shown in FIG. 3 in more detail. Such services may include one or more of the following system functions:
1) power management control,
2) environmental monitoring,
3) enclosure management and event logging
4) fan control,
5) voltage rail monitoring, and
6) system status monitoring.

Other service functions may be included if desired. The service processor is also responsible for monitoring and reporting the operational status of the system. The processor operates from the +5 V rail and is capable of power cycling and resetting of the host system. It is based on an MPC850 PowerPC design with dedicated flash ROM 62 and synchronous dynamic RAM (SDRAM) 64, although any of a number of other processors may be employed.

Peripheral devices that are required for the management functions, may include the system configuration card (SCC) reader 20, PCI clock generator 52, general purpose Input Output (GPIO) devices 54, field replaceable unit identification (FRUID) devices 56, a "time-of-day" (TOD) real time clock 57, and a system temperature monitor 58. These may be provided by a dedicated IC, in this case an Analogue Devices ADM1026 IC, although others may be used. These devices are provided on an inter-integrated circuit (I2C) management bus 60. As shown in FIG. 3, in addition to the flash ROM 62 and DRAM 64, the service controller can access electrically erasable programmable ROM (EEPROM) 66 that is provided in the temperature monitor 58 via the I2C management bus 60.

Figure 4:
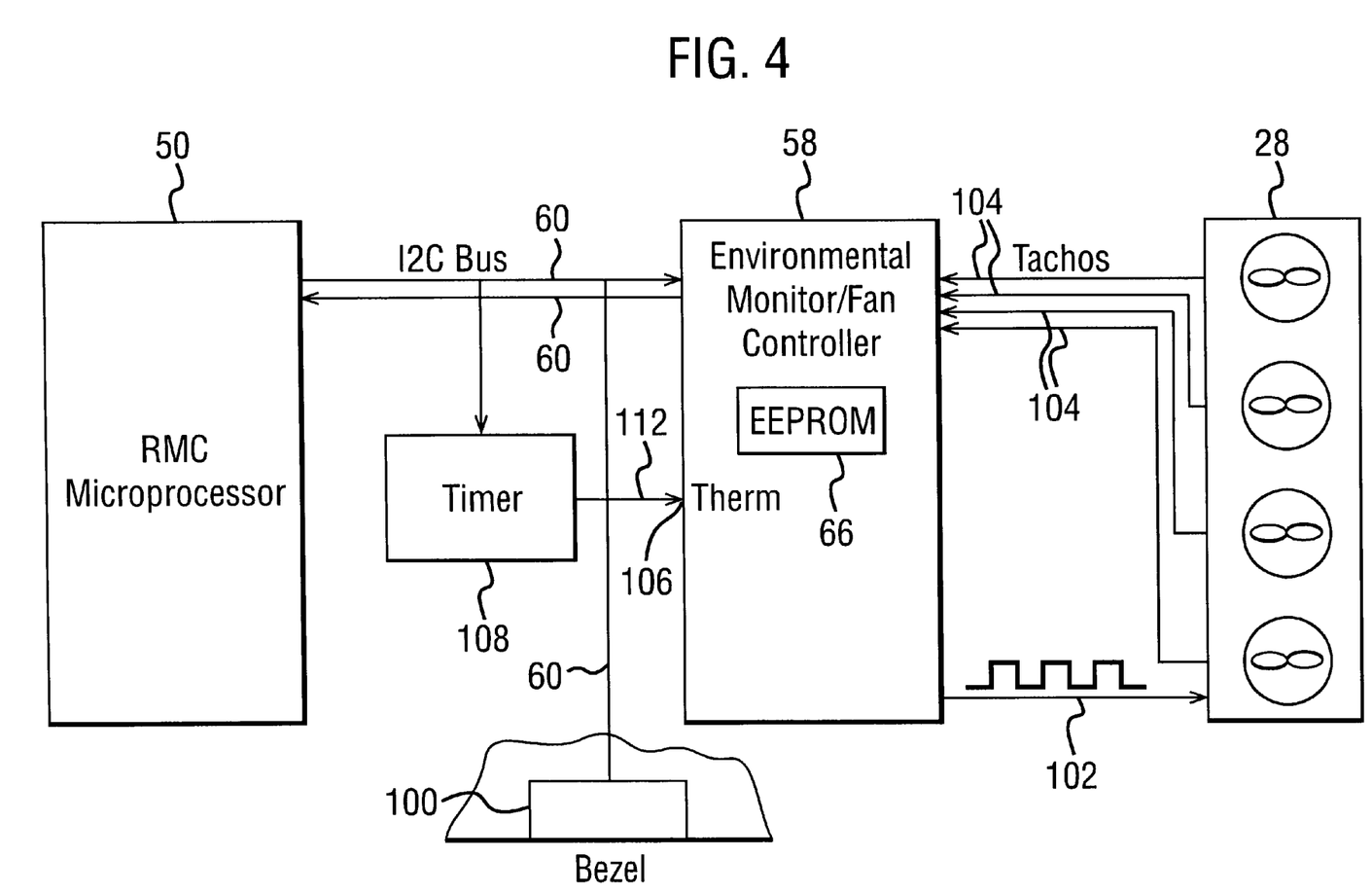
FIG. 4 is a schematic diagram showing the interconnection between the service processor and a fan controller of the system.

FIG. 4 shows the connection between the service processor 50, the temperature monitor 58 and the enclosure fans 28, according to one embodiment of the invention. The temperature monitor IC does, in fact, have its own junction internal temperature monitor, but this is not used for the purposes of temperature sensing in the system according to this embodiment because sensing temperature within the enclosure may be extremely sensitive to the positioning of other components within the enclosure and to changes of the components. For this reason, a separate silicon band gap temperature monitor 100 may be located in the front bezel 16 so that it measures the temperature of the external air that is introduced into the enclosure rather than that of air within the enclosure. The temperature value is encoded by the monitor 100 into an eight bit word and is sent to the service processor along the I2C management bus 60 when requested by the service processor.

Figure 5:
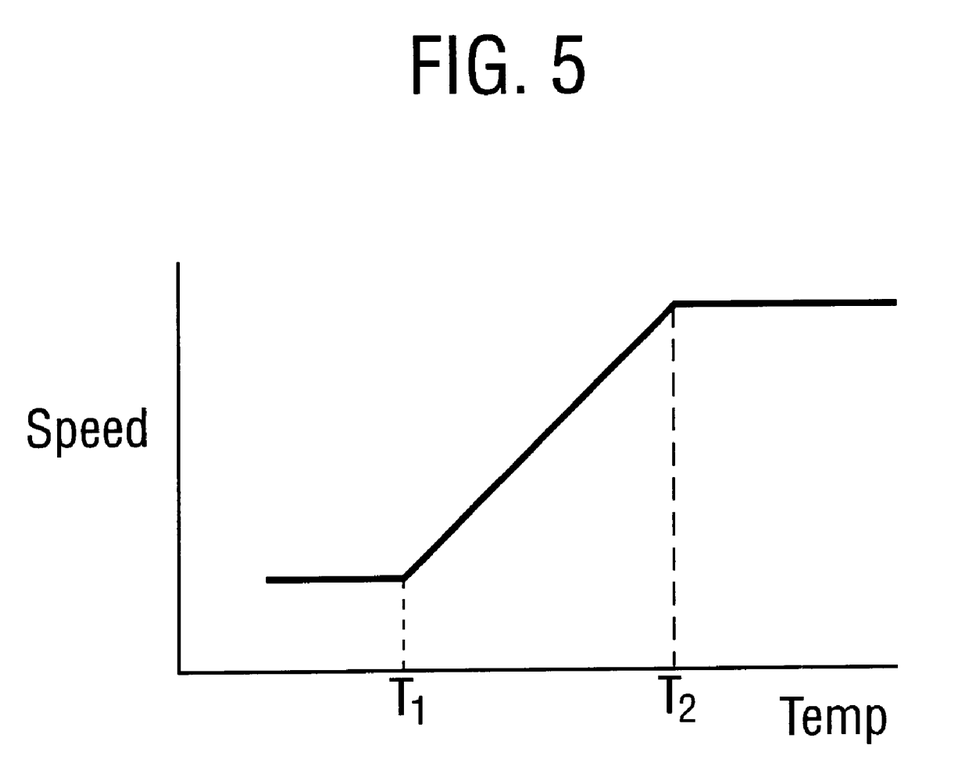
FIG. 5 is a graph showing the fan speed set by the service processor against the measured temperature.

The processor then calculates the desired fan speed in accordance with a speed table that has been input into the service processor memory, for example into the EEPROM 66 of the temperature monitor 58. FIG. 5 shows an example of such a speed requirement. The fan speed required is relatively low, and constant with respect to temperature, until a first temperature $T_1$ at which point the required fan speed increases linearly with temperature until temperature $T_2$ is reached, when, again, a speed that is constant with respect to temperature is required. The upper constant speed above $T_2$ may well be because the fans 28 are already running at maximum speed. The precise values of temperatures $T_1$ and $T_2$ will vary depending on the enclosure design, the fans and the other components.

The service processor then sends the required fan speed value to the temperature monitor 58 via the I2C management bus 60, whereupon it is converted to a pulse width modulated (PWM) signal and sent to the control input of the fan unit 28 along line 102.

The temperature monitor 58 also provides counter inputs which are used to monitor the rotational speed of all the fans within the enclosure, not only the enclosure fans 28, but also the dedicated fans for the CPUs. The fans provide tachometer output signals for this purpose, along lines 104. The signals are open-drain and two pulse-per-revolution logic format. The service processor compares the measured speed values against minimum thresholds and issues alerts when required.

As described, the service processor runs the enclosure fans 28 under open-loop control in accordance with the fan speed requirement given in FIG. 5. The service processor could, if desired, run the fans under closed-loop control, for example by reading the tachometer data supplied to the temperature monitor 58 along lines 104 and taking the difference between the tachometer readings and a demanded tachometer level.

In addition to sending the fan speed values to the fan controller 58, the service processor sends the values to a timer 108 along an arm 110 of the I2C management bus. The timer is in the form of a counter that is initialised to a predetermined value each time it receives a pulse (the fan speed value) and then proceeds to count down. The initial value set in the counter is such that the time taken for the counter to count down to zero, for example two seconds, is always greater than the period between fan speed commands sent by the service processor, for example one second, so that in normal operation the timer will be re-initialised by the service processor before it has expired (counted down to zero). The I2C line may be made up of a number of unidirectional/simplex lines in which case the timer 108 should be connected to the line carrying traffic from the service processor to the peripheral components so that it is only re-initialised by traffic originating from the service processor.

The timer 108 has an output that is connected to the thermal reset input 106 of the fan controller by line 110. If, for any reason, the timer expires due to the absence of a signal from the service controller 50, the output of the timer will go high and pull up the thermal reset input 106 of the fan controller 58, thereby causing the fan controller to output a maximum speed value (a constant d.c. signal) to the fan unit 28 along the line 102 and setting the fans to full speed.

In this way, the timer acts in the same manner as a watchdog, requiring a periodic output from the service processor 50 in order to ensure that it is functioning correctly, and if no such signal is received, the peripheral components are put into a state that is appropriate for a malfunction of the service processor. This arrangement has the advantage over an internal watchdog in the service processor in that it will be activated by software faults in the service processor that may still allow the service processor to send signals to its internal watchdog. In addition, should any fault occur on the I2C bus, for example due to interference or a fault on another peripheral device, which fault will prevent signals from the service processor 50 reaching the fan controller 58, the fault will also prevent the signals reaching the timer 108 which will actuate the thermal reset input of the fan controller.

Figure 6:
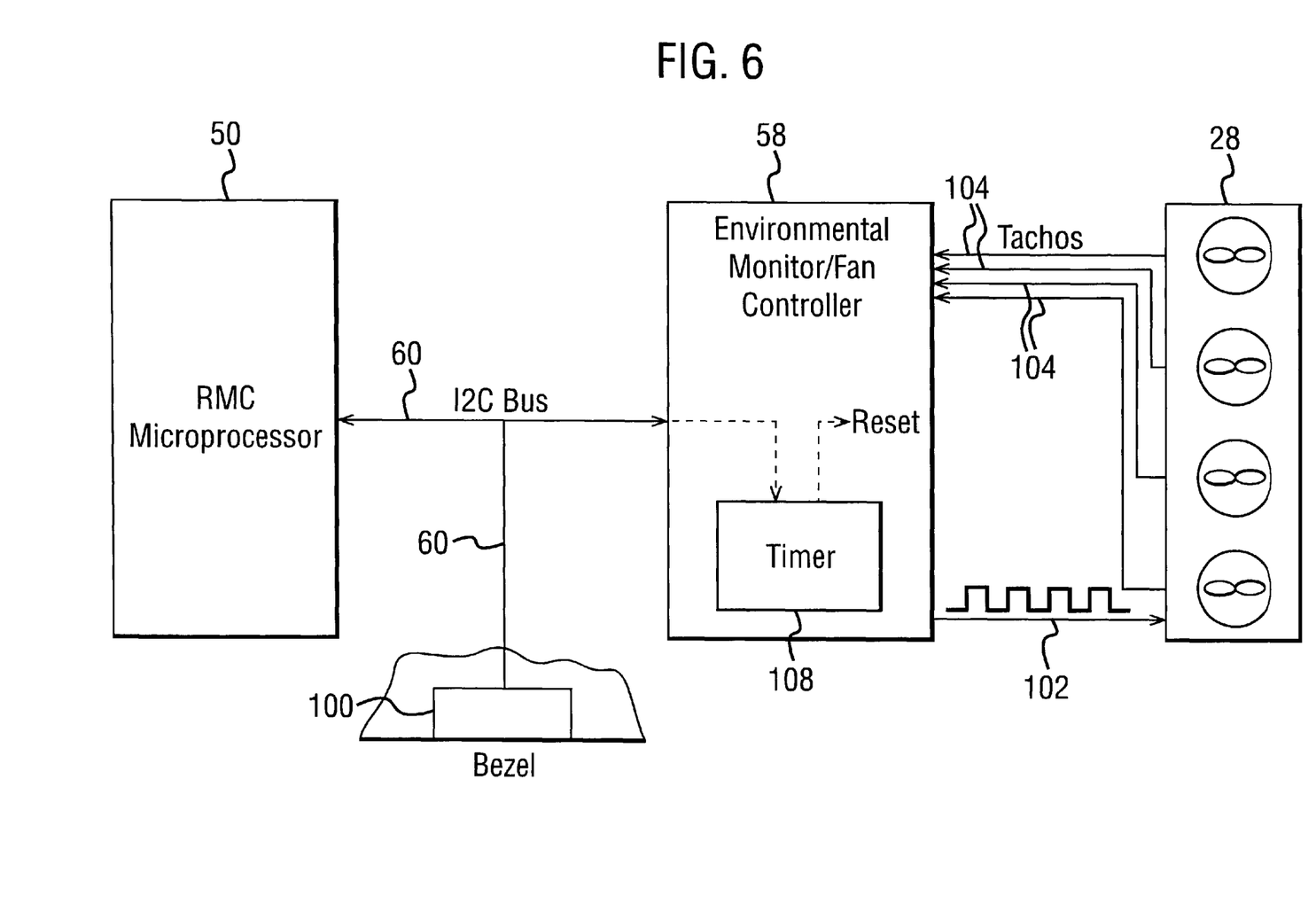
FIG. 6 is a schematic diagram showing an arrangement according to the invention with a timer integrated into a peripheral component.

FIG. 6 shows the same arrangement as shown in FIG. 4, but in which the timer 108 is physically integrated in the fan controller 58 integrated circuit. In the following description, the timer 108 is shown as being separate from the various peripheral components, but this is merely for the sake of clarity. It may, if desired be integrated into any one or more of the components.

Figure 7:
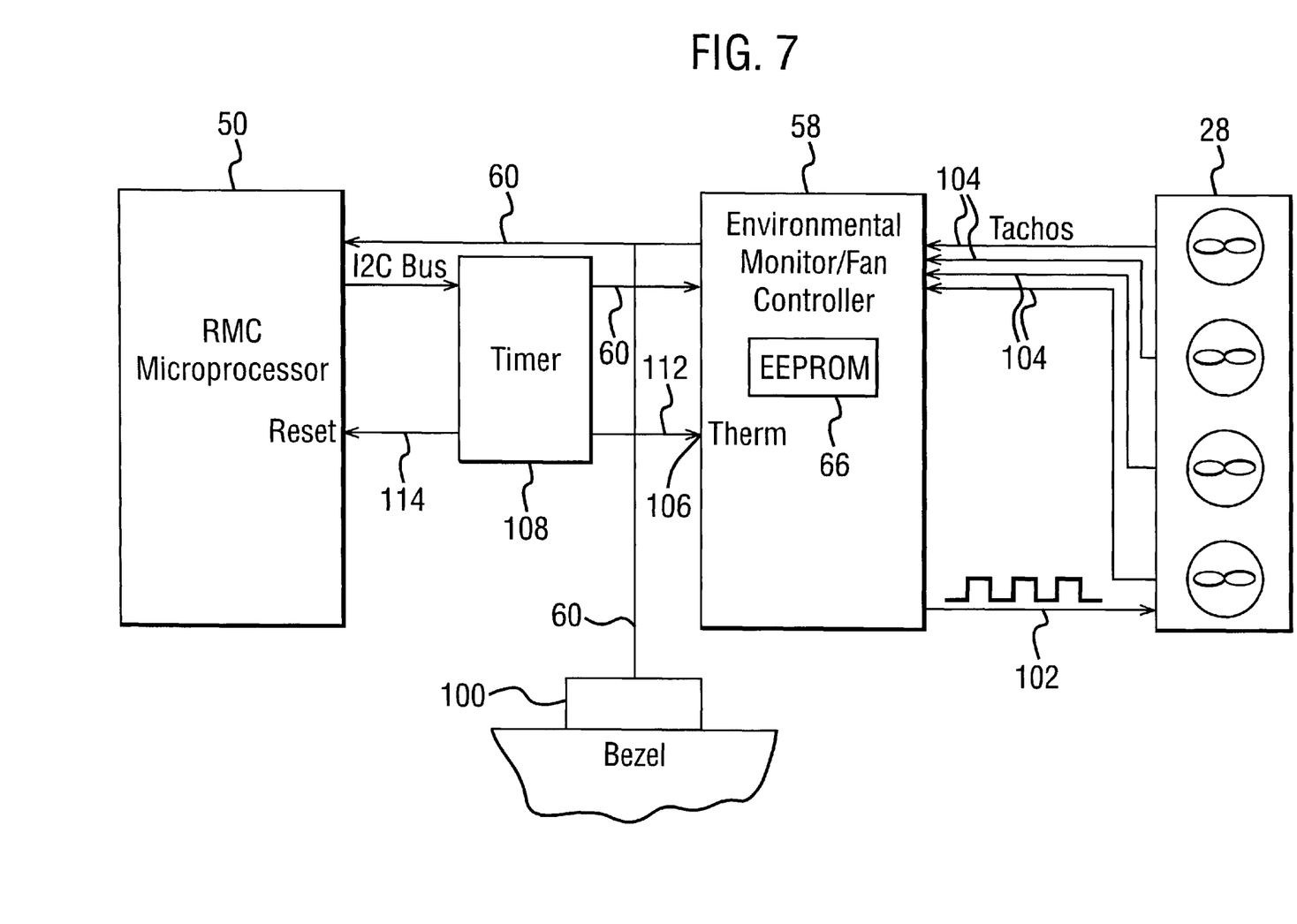
FIG. 7 is a schematic diagram showing an alternative arrangement of service processor and fan controller.

FIG. 7 shows a modification of the arrangement shown in FIG. 6. In the arrangement shown in FIG. 6 the service processor 50, timer 108 and fan controller 58 were connected in a bus arrangement in which signals from the service processor were sent simultaneously to both the timer 108 and the fan controller 58. In the arrangement shown in FIG. 7, the service processor and timer are connected in a first-in-first-out (FIFO) arrangement in which the I2C management bus 60 passes through the timer 108 in the direction from the service processor 50 to the fan controller 58 so that all signals from the service processor to the fan controller pass through the timer 108.

Also, in addition to the timer output being sent to the thermal reset input 106 of the fan controller 58, it is sent to the reset input of the of the service processor, thereby causing resetting of the service processor 50 as well as the fan controller 58. This arrangement has the advantage of aiding diagnosis of the fault that has caused the timer to expire and determination of whether it is a software or hardware fault.

Figure 8:
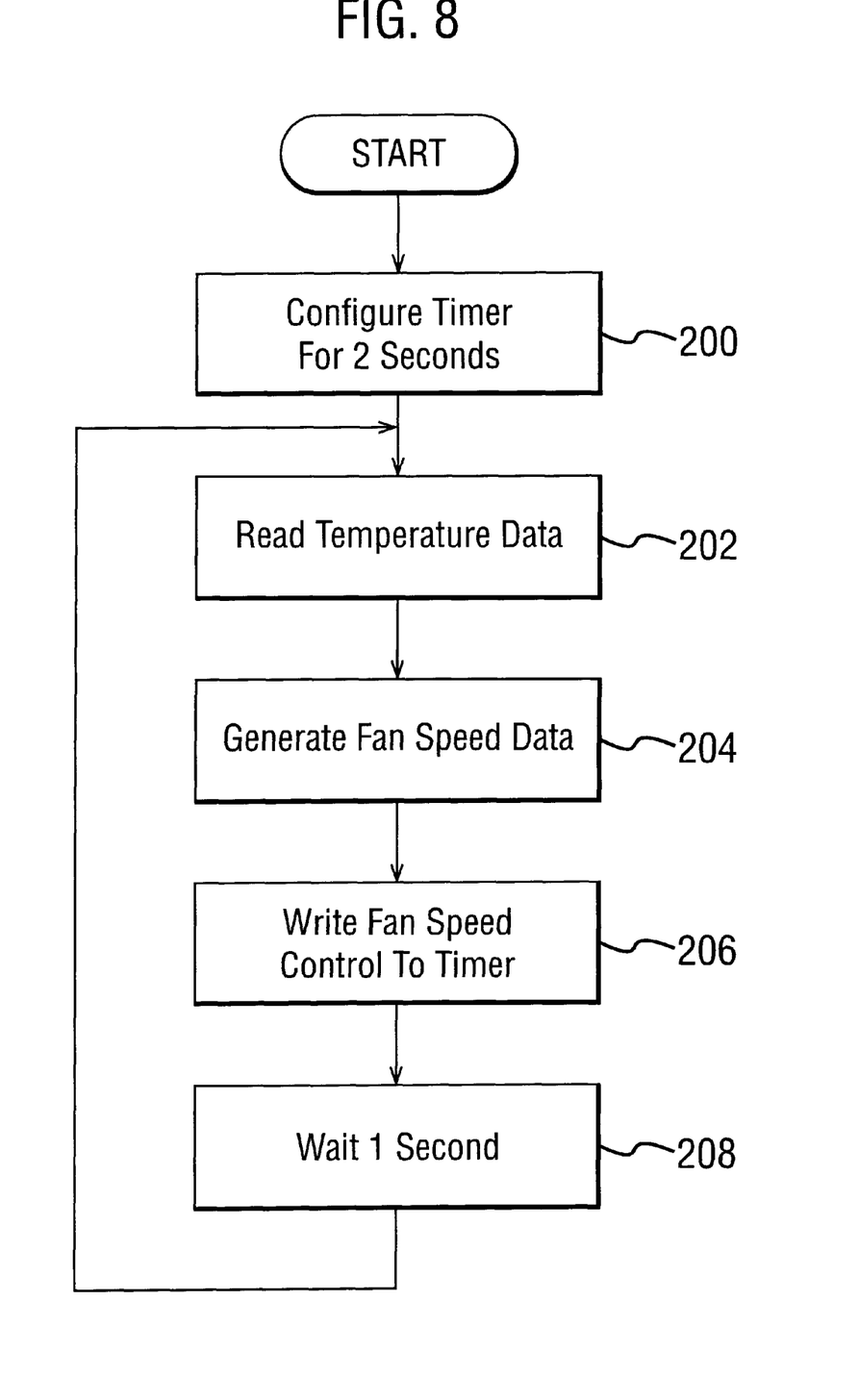
FIG. 8 is a flow diagram showing part of the startup routine of the service processor.

FIG. 8 is a flow diagram showing part of the management program of the service processor 50 employed to run the fan controller 58. Following booting of the service processor, the service processor configures the timer 108 to expire after an appropriate time period, for example two seconds, (operation 200). The service processor then reads the temperature value from the temperature sensor 100 in the front bezel 16 (operation 202) and processes the temperature value for example in accordance with the graph in FIG. 5 in order to generate a desired fan speed (operation 204). This fan speed value is then sent to the fan controller 58 either via the timer 108 as shown in FIG. 7 or in addition to the timer as shown in FIG. 4 (operation 206). The service processor then subjects itself to an appropriate delay (operation 208) and returns to the temperature reading operation approximately one second later.

The timer 108 will re-initialise on receipt of the fan speed data from the service processor so that it will be set to expire two seconds later, and sends the fan speed data onwards to the fan controller 58 if the arrangement is as shown in FIG. 7. If the timer expires the thermal reset input on the fan controller will be pulled high to set the fans to full speed. If the fault in the service processor is rectified, for example by resetting it, the service processor may then reconfigure the timer as part of its boot program, in which case the thermal reset input 106 of the fan controller will be pulled down, and the fans will again be managed intelligently by the service processor.

Figure 9:
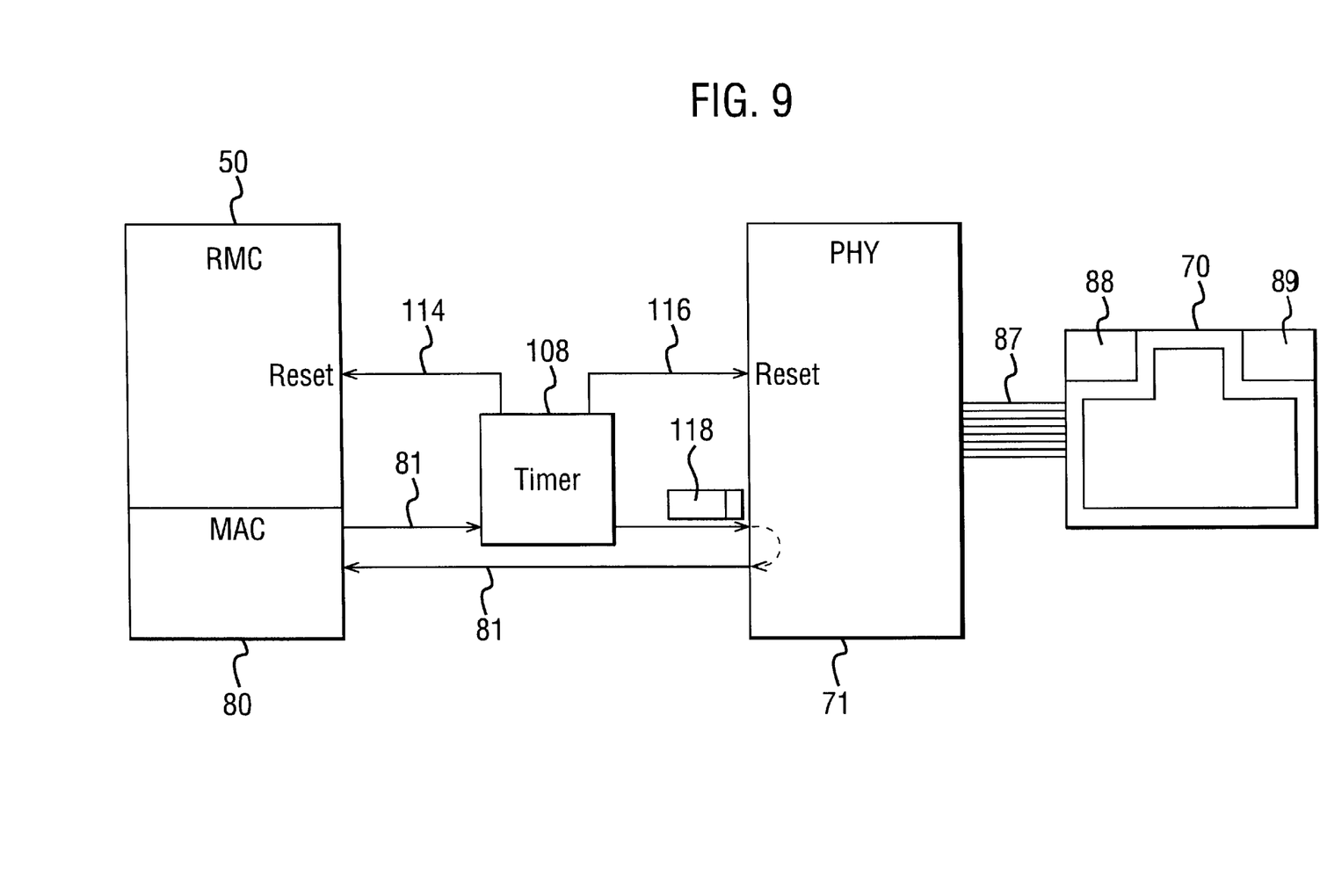
FIG. 9 is a schematic diagram showing the connection between the service processor and an ethernet interface.

FIG. 9 shows the connection of the service processor 50 to the management ethernet port 70 which provides access to a remote network administrator.

Signals from the service processor to the ethernet port 70 are controlled within the service processor by a media access controller (MAC) 80 which handles the open systems interconnection (OSI) level 2 (data link layer) protocols, and are sent to the ethernet port 70 via lines 81 and a physical interface or PHY 71 which provides power for sending the signals along the ethernet cabling, and provides other functions such as a clock, and line coding. Manchester encoding is employed in this case, but other forms of line coding may be used that are appropriate to the channel characteristics.

Management data is transmitted between the PHY 71 and the ethernet port 70 by means of an eight conductor cable 87. In addition, LEDs 88, 89 on the RJ45 socket forming the ethernet port will light up, one LED indicating that the port is operative, and the other LED turning on whenever there is traffic on the line. Other forms of cable may be employed, depending on the form of the ethernet port, and indeed other forms of port may be used.

If a fault occurs in the service processor, interference from other components, in particular from the host processors, may be picked up by the lines 81 and sent to the network by the physical interface 71 unless the ethernet port is quiesced. This is achieved by placing the timer 108 in the line 81 that sends data from the MAC 80 of the service processor to the physical interface 71, so that the timer is re-initialised by traffic sent from the service processor. It would be possible for the timer to expire during periods in which no traffic was sent by the service processor, and so the service processor may be configured to send internal loop-back packets 118 to the physical interface 71 on a periodic basis. Such packets may contain no data, but simply include a header with an address that causes it to return to the service processor.

In the event of a fault in the service processor, no further data will be sent from the MAC, causing the timer to expire and reset the physical interface 71 via line 116. The timer may also reset the service processor 50 if desired as described in FIG. 7.

Figure 10:
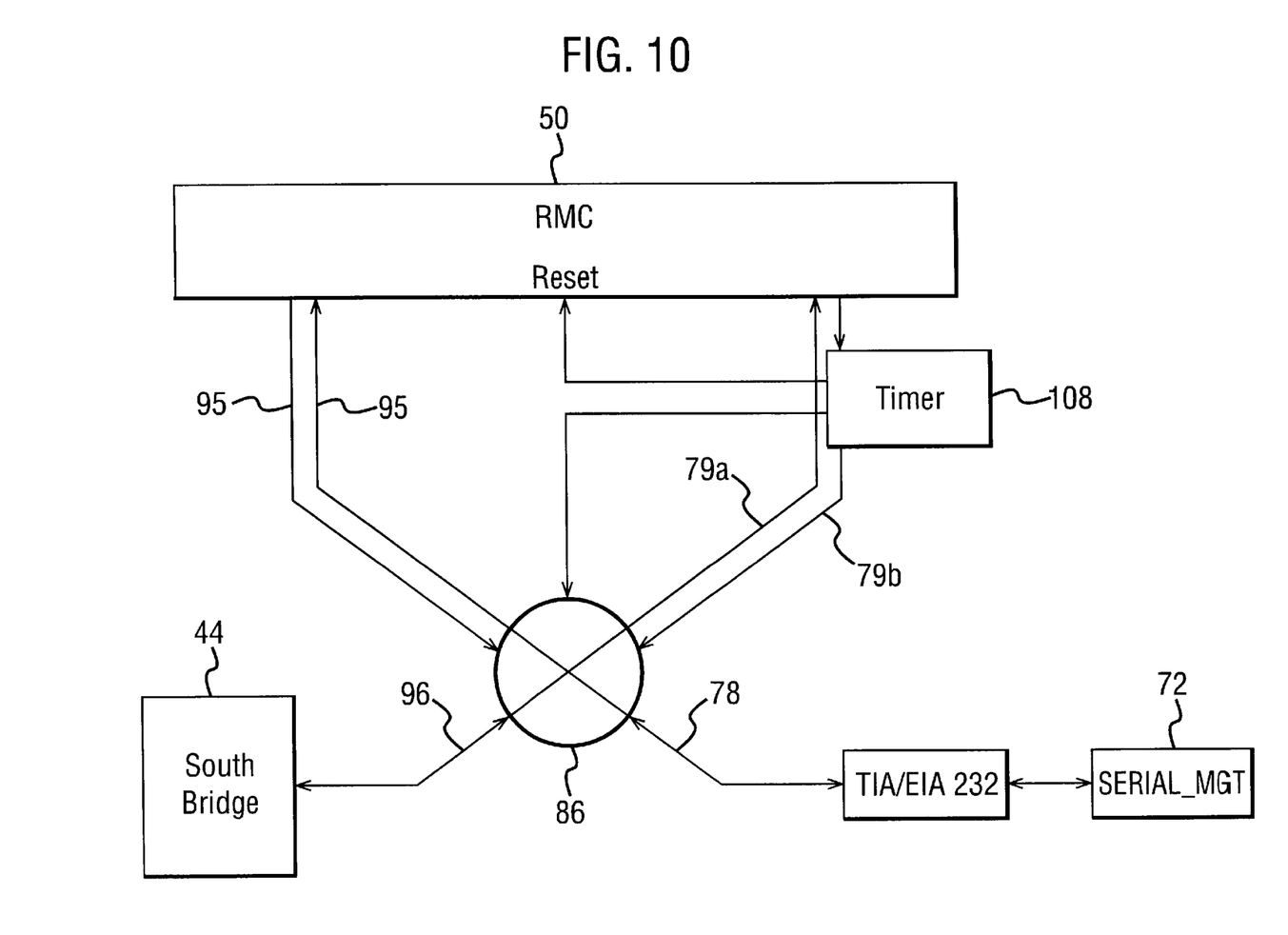
FIG. 10 is a schematic diagram showing the connection between the service processor and a management serial port.

FIG. 10 shows the connection between the service processor 50, the host processor PCI I/O device 44 and the asynchronous serial port 72 (SERIAL_MGT). The PCI I/O device 44 and the service processor 50 are connected to the serial port 72 via a switching device such as a multiplexer 86 so that, in normal operation, all traffic from the serial port is routed to the service processor 50 via lines 78, 79 and the multiplexer 86. On receipt of the signal from the serial port 72, the service processor 50 determines whether the signal is a management mode command, in which case it is acted upon by the service processor, or whether it is a console mode command, in which case the service processor routes the signal to the console interface 44 via line 96, multiplexer 86 and line 96. In this way, the host processors are not continually interrupted by service management traffic.

If, however, a fault occurs in the service processor, access to the host processors will be lost unless the multiplexer 86 can be switched to allow signals to be transferred between the serial port 72 and the console interface 44 directly, bypassing the service processor 50. This may be achieved by placing a timer 108 in one of the serial lines, for example as shown in FIG. 9, between the service processor and the multiplexer 86. The lines may be formed from a pair of unidirectional/simplex lines 79a and 79b with traffic running in opposite directions, in which case the timer 108 may be inserted in the line 79b carrying traffic from the service processor 50 to the multiplexer 86 so that it is re-initialised only by signals originating from the service processor. The timer 108 may be set to expire after a predetermined period has elapsed since initialisation, for example two seconds, and the service processor may be arranged to send a signal to the timer at shorter intervals, for example at one second intervals.

While the timer is being periodically re-initialised, it will allow traffic from the serial port 72 to be sent to the service processor 50 via the multiplexer, but if no re-initialisation signal is received by the timer, it will set the multiplexer 86 to block traffic to and from lines 79 and 95, and allow traffic to pass directly between lines 78 and 96, thereby bypassing the service processor 50.

In the arrangements shown in FIG. 9 and FIG. 10, if the timer 108 is reconfigured by the service processor 50 as part of its boot procedure, the timer may restore the peripheral components (the physical interface 71 and the multiplexer 86) to their initial state.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. A computer system which comprises:
   (i) a service processor for providing system management functions for the system;
   (ii) at least one peripheral component that communicates with, and/or is controlled by, the service processor via a communication or control line; and
   (iii) a timer that is separate from the service processor and which will set the peripheral component into a different state unless the timer is initialised by the service processor at a predetermined rate;
   wherein the service processor sends initialisation signals to the timer along the communication or control line.

2. A system as claimed in claim 1, wherein the timer is physically integrated within the or a peripheral component.

3. A system as claimed in claim 1 wherein, if the timer has not been initialised by the service processor after a defined length of time, the timer resets the service processor.

4. A system as claimed in claim 1, wherein the timer sets the peripheral component into a state in which it is quiesced or will operate independently of the service processor.

5. A system as claimed in claim 1, wherein the service processor sends periodic signals to the peripheral component for controlling a function provided by the component.

6. A system as claimed in claim 5, wherein the periodic signals are also sent to the timer.

7. A system as claimed in claim 6, wherein the periodic signals are sent to the peripheral component via the timer.

8. A system as claimed in claim 5, wherein the periodic signals are used to initialise the timer.

9. A system as claimed in claim 5, wherein the periodic signals are sent at the said predetermined rate.

10. A system as claimed in claim 1, wherein the timer is configured during booting of the service processor to reset the service processor after a defined period has elapsed following initialisation of the timer, the defined period being greater than the periods between the initialisation signals sent by the service processor.

11. A system as claimed in claim 1, which includes at least one host processor in addition to the service processor.

12. A system as claimed in claim 1, wherein the peripheral component is a fan controller that provides a driving signal for one or more fans.

13. A system as claimed in claim 12, which includes a temperature sensor, and the service processor generates fan speed signals in response to temperature values detected by the temperature sensor.

14. A system as claimed in claim 12, wherein, if the timer is not initialised, it will set the fan controller into a state in which it alters the driving signal to increase the fan speed to a predetermined fan speed.

15. A system as claimed in claim 13, wherein, if the timer is not initialised, the fan controller will increase the fan speed to the maximum that can be driven by the fan controller.

16. A system as claimed in claim 12, wherein the service processor generates the fan speed signals under open-loop control.

17. A system as claimed in claim 12, wherein the service controller generates fan speed signals to increase the speed of the fan(s) linearly with temperature, at least over a predetermined temperature range.

18. A system as claimed in claim 12, wherein the communication or control line is an internal system management bus.

19. A system as claimed in claim 1, wherein the peripheral component is a management communication device that allows transfer of system management data between the service processor and an external user.

20. A system as claimed in claim 19, wherein the peripheral component is a physical interface to a management ethernet port.

21. A system as claimed in claim 20, wherein the communication or control line is an internal ethernet line that extends between the service processor and the physical interface.

22. A system as claimed in claim 1, which includes at least one host processor, and a user interface, and wherein the peripheral component is a device for routing commands and data to and from the user interface via the service processor, the device enabling commands and data to be transferred between the host processor and the user interface bypassing the service processor when the device is set in its different state.

23. A system as claimed in claim 22, wherein the data and commands are transmitted along a management serial line which provides the communication or control line.

24. A system as claimed in claim 22, wherein the device for routing commands and data is a multiplexer.

25. A system as claimed in claim 1, which is a computer server.

26. A method of operating a computer system which comprises:
   (i) sending signals from a service processor to a peripheral component and to a timer along an internal communication or control line at a predetermined minimum rate;
   (ii) initialising the timer on receipt of the signals by the timer; and
   (iii) setting the peripheral component into a different state if the timer has not been initialised within a predetermined time period.

27. A method as claimed in claim 26, wherein the timer resets the service processor if it has not been initialised within the said predetermined time period.

* * * * *